(12) United States Patent
Kong

(10) Patent No.: US 8,203,130 B2
(45) Date of Patent: Jun. 19, 2012

(54) IMAGE SENSOR MODULE, METHOD OF MANUFACTURING THE SAME, CAMERA MODULE INCLUDING THE SAME AND ELECTRONIC DEVICE INCLUDING THE CAMERA MODULE

(75) Inventor: Yung-Cheol Kong, Cheonan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/240,158

(22) Filed: Sep. 22, 2011

(65) Prior Publication Data

US 2012/0009718 A1 Jan. 12, 2012

Related U.S. Application Data

(62) Division of application No. 12/361,774, filed on Jan. 29, 2009, now Pat. No. 8,053,714.

(30) Foreign Application Priority Data

Feb. 1, 2008 (KR) .................................. 2008-10755

(51) Int. Cl.
*G01N 21/86* (2006.01)
*G02B 3/10* (2006.01)
*G02B 7/02* (2006.01)
*H04N 5/225* (2006.01)

(52) U.S. Cl. .............. 250/559.27; 359/721; 359/811; 348/340

(58) Field of Classification Search .............. 250/201.2, 250/201.3, 201.4, 559.27, 559.28; 359/813–815, 359/821–826, 721, 811; 348/335, 340
See application file for complete search history.

(56) References Cited

U.S. PATENT DOCUMENTS 7,535,626 B2 * 5/2009 Kosaka et al. ................ 359/319
2007/0070511 A1 3/2007 Lee et al.

FOREIGN PATENT DOCUMENTS

| KR | 10-0431260 | 4/2004 |
| KR | 10-0729501 | 6/2007 |

* cited by examiner

*Primary Examiner* — Georgia Y Epps
*Assistant Examiner* — Don Williams
(74) *Attorney, Agent, or Firm* — Stanzione & Kim, LLP

(57) ABSTRACT

An image sensor module may include an image sensor, a variable thickness member and a lens member. The image sensor may include a light receiver configured to receive a light. Further, a driving voltage may be applied to the image sensor. The variable thickness member may be arranged on the image sensor adjacent to the light receiver. Further, the variable thickness member may have a variable thickness along an optical axis of the light in accordance with the driving voltage through the image sensor.

7 Claims, 9 Drawing Sheets

IMAGE SENSOR MODULE, METHOD OF MANUFACTURING THE SAME, CAMERA MODULE INCLUDING THE SAME AND ELECTRONIC DEVICE INCLUDING THE CAMERA MODULE

CROSS-REFERENCE TO RELATED APPLICATIONS

This application is a divisional application of U.S. application Ser. No. 12/361,774, filed on Jan. 29, 2009, now U.S. Pat. No. 8,053,714, which claims priority under 35 U.S.C. §119 from Korean Patent Application No. 2008-10755 filed on Feb. 1, 2008 in the Korean Intellectual Property Office (KIPO), the contents of which are herein incorporated by reference in their entirety.

BACKGROUND

1. Field of the Invention

The present general inventive concept relates to a sensing apparatus, an image sensor module, a method of manufacturing the same, a camera module including the same, and an electronic device including the camera module. More particularly, the present general inventive concept relates to a sensing apparatus, an image sensor module that may be capable of automatically controlling a focus by moving positions of a lens, a method of manufacturing the image sensor module, a camera module including the image sensor module, and an electronic device including the camera module.

2. Description of the Related Art

Generally, an image sensor module may include an image sensor for converting optical information into electrical signals. The image sensor may include a charge coupled device image sensor and a CMOS image sensor. A cellular phone, which may have a camera function as well as a communication function by installing the image sensor module in the cellular phone, may be widely used.

A recently developed image sensor module may include an automatic focusing device for moving positions of a lens to align an optical length of the lens with a focusing distance, thereby obtaining a clear display. A camera module including the automatic focusing device may change a focusing distance in accordance with a distance between an object and an image sensor module to have a wide distance range with respect to the object. Particularly, a wafer level image sensor module may have been developed. The wafer level image sensor module may be manufactured by stacking an image sensor wafer and a lens wafer, and cutting the image sensor wafer and the lens wafer to form a plurality of image sensor modules.

However, in the conventional wafer level image sensor module, an attachment clearance between the image sensor wafer and the lens wafer may be generated. Thus, the image sensor module may be determined to be abnormal due to the attachment clearance, so that a product yield of the image sensor module may be remarkably reduced.

Further, the conventional automatic focusing device may be mechanically driven. When the mechanically driven automatic focusing device may be applied to the wafer level image sensor module, the image sensor module may have a complicated structure and a heavy weight.

SUMMARY

The present general inventive concept provides a sensing apparatus, for example, an image sensor module that may be capable of being applied to a wafer level camera module and having a slim structure and an automatic focusing function.

The present general inventive concept also provides a method of manufacturing the above-mentioned image sensor module.

The present general inventive concept still also provides a camera module including the above-mentioned image sensor module.

The present general inventive concept yet still also provides an electronic device including the above-mentioned camera device.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an image sensor module. The image sensor module may include an image sensor, a variable thickness member and a lens member. The image sensor may include a light receiver configured to receive a light. Further, a driving voltage may be applied to the image sensor. The variable thickness member may be arranged on the image sensor adjacent to the light receiver. Further, the variable thickness member may have a variable thickness along an optical axis of the light in accordance with the driving voltage through the image sensor. The lens member may be arranged on the variable thickness member. The lens member may be moved along the optical axis in accordance with the thickness of the variable thickness member.

The image sensor may include a substrate, at least one external terminal, at least one bonding pad and at least one electrode. The light receiver may be formed on the substrate. The external terminal may be formed on a first surface of the substrate to receive the driving voltage. The bonding pad may be formed on an edge portion of a second surface of the substrate opposite to the first surface. The boding pad may be electrically connected to the variable thickness member. The electrode may penetrate the edge portion of the substrate to electrically connect between the external terminal and the bonding pad.

The variable thickness member may have an annular shape configured to cover the bonding pad. Further, the variable thickness member may include a conductive polymer of which a volume may vary in accordance with the driving voltage. The conductive polymer may include a piezoelectric material.

The foregoing and/or other aspects and utilities of the present general inventive concept may also be achieved by providing a method of manufacturing an image sensor module. In the method of manufacturing the image sensor module, an image sensor wafer including at least one image sensor and a bonding pad may be prepared. The bonding pad may be arranged on an edge portion of the image sensor to receive a driving voltage. A variable thickness member may be attached to the image sensor wafer. The variable thickness member may have a variable thickness in accordance with the driving voltage. A lens wafer including at least one lens layer may be formed on the variable thickness member.

The image sensor wafer may be prepared by forming the image sensor on a substrate, forming the bonding pad on an edge portion of the substrate, and forming an electrode through the edge portion of the substrate to be electrically connected with the bonding pad. Further, a thermo compression bonding process may be performed on the edge portion of the substrate to attach the variable thickness member to the edge portion of the substrate.

Alternatively, an ultraviolet curing process may be performed on the edge portion of the substrate to attach the variable thickness member to the edge portion of the substrate. The variable thickness member may include a conductive polymer of which a volume may vary in accordance with the driving voltage. The conductive polymer may include a piezoelectric material.

The image sensor wafer may include a plurality of the image sensors. Further, the lens wafer may include the single lens layer. In this case, the method may further include cutting the image sensor wafer and the lens wafer to form a plurality of the image sensor modules. Each of the image sensor modules may include the single image sensor and the single lens layer.

The foregoing and/or other aspects and utilities of the present general inventive concept may also be achieved by providing a camera module. The camera module may include a main substrate, an image sensor, a variable thickness member and a lens member. The main substrate may generate a driving voltage. The image sensor may include a light receiver configured to receive a light. Further, the driving voltage may be applied to the image sensor. The variable thickness member may be arranged on the image sensor adjacent to the light receiver. Further, the variable thickness member may have a variable thickness along an optical axis of the light in accordance with the driving voltage through the image sensor. The lens member may be arranged on the variable thickness member. The lens member may be moved along the optical axis in accordance with the thickness of the variable thickness member.

The camera module may further include a controller arranged on the main substrate to control the driving voltage.

The image sensor may include a substrate, at least one external terminal, at least one bonding pad and at least one electrode. The light receiver may be formed on the substrate. The external terminal may be formed on a first surface of the substrate to receive the driving voltage. The bonding pad may be formed on an edge portion of a second surface of the substrate opposite to the first surface. The boding pad may be electrically connected to the variable thickness member. The electrode may penetrate the edge portion of the substrate to electrically connect between the external terminal and the bonding pad.

The foregoing and/or other aspects and utilities of the present general inventive concept may also be achieved by providing an electronic device. The electronic device may a camera module, a controlling member, an inputting member and a displaying member. The camera module may include a main substrate, an image sensor, a variable thickness member and a lens member. The main substrate may generate a driving voltage.

The image sensor may include a light receiver configured to receive a light. Further, the driving voltage may be applied to the image sensor. The variable thickness member may be arranged on the image sensor adjacent to the light receiver. Further, the variable thickness member may have a variable thickness along an optical axis of the light in accordance with the driving voltage through the image sensor. The lens member may be arranged on the variable thickness member. The lens member may be moved along the optical axis in accordance with the thickness of the variable thickness member. The controlling member may apply a control signal to the camera module. The inputting member may input a command into the controlling member. The displaying member may display an image based on image signals generated from the camera module.

The variable thickness member having the variable thickness in accordance with the driving voltage may be interposed between the image sensor and the lens member, so that the image sensor module may have an automatic focusing function. Further, when an attachment clearance may be generated between the image sensor and the lens, a distance between the image sensor and the lens may be optimized by applying the driving voltage to the variable thickness member, so that a product yield of the wafer level camera module may be significantly improved.

The foregoing and/or other aspects and utilities of the present general inventive concept may also be achieved by providing a method of forming an image sensor module, the method including forming an image sensor having a light receiver and an electrode, forming a lens member disposed to transmit a signal to the light receiver of the image sensor, and forming a variable thickness member between the image sensor and the lens member to control a distance between the image sensor and the lens member according to a driving signal applied through the electrode of the image sensor.

The foregoing and/or other aspects and utilities of the present general inventive concept may also be achieved by providing a sensor module including an image sensor having a light receiver and an electrode, a lens member disposed to transmit a signal to the light receiver of the image sensor, and a variable thickness member disposed between the image sensor and the lens member to control a distance between the image sensor and the lens member according to a driving signal applied through the electrode of the image sensor.

The image sensor may further include a plurality of external terminals to be connected to the respective ones of the light receiver and the electrode.

The sensor module may further include an external device having a main substrate formed with a plurality of pads to be connected to the respective external terminals of the image sensor.

The external device may include a unit to perform an operation according to data corresponding to the signal of the image sensor.

The image sensor may include a substrate, the light receiver may be disposed on the substrate, and the electrode may be formed in the substrate to be exposed to the variable thickness member to change a thickness of the variable thickness member according to the driving signal.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which

DETAILED DESCRIPTION OF THE EMBODIMENTS

Figure 1:
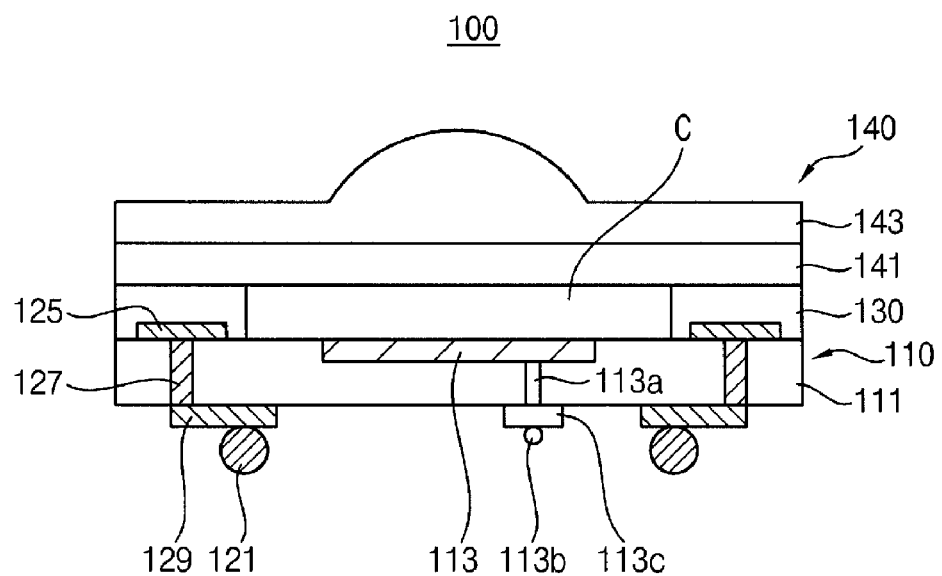
FIG. 1 is a cross-sectional view illustrating an image sensor module according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
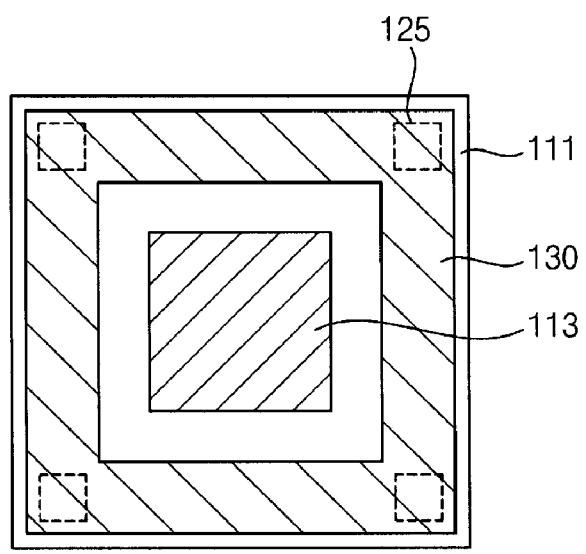
FIG. 2 is a plan view illustrating an image sensor of the image sensor module in FIG. 1.
Figure 3:
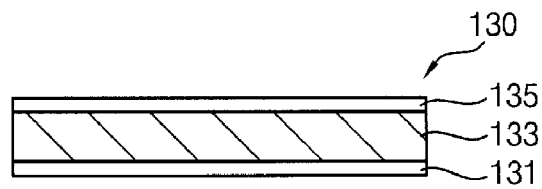
FIG. 3 is a cross-sectional view illustrating a variable thickness member of the image sensor module in FIG. 1.

FIG. 1 is a cross-sectional view illustrating a sensing apparatus, for example, an image sensor module according to an embodiment of the present general inventive concept, FIG. 2 is a plan view illustrating an image sensor of the image sensor module in FIG. 1, and FIG. 3 is a cross-sectional view illustrating a variable thickness member of the image sensor module in FIG. 1. The sensing apparatus may be a signal sensing module, a light sensing module, etc. to sense an external signal, such as a light beam, corresponding to an object or an image to be detected. However, the present general inventive concept is not limited thereto. Other type of a sensing apparatus can be used as the sensing apparatus of the present general inventive concept.

Referring to FIGS. 1 to 3, the image sensor module 100 of this example embodiment may include an image sensor 110, a variable thickness member 130 and a lens member 140.

The image sensor 110 may convert an optical image into an electrical signal using a light reflected from an object. In some example embodiments, examples of the image sensor 110 may include a charge coupled device (CCD) image sensor, a complementary metal oxide semiconductor (CMOS) image sensor, etc. Although not illustrated in drawings, the CMOS image sensor may include a photodiode to sense a light, and a logic circuit to convert the light into an electrical signal as a unit pixel. Further, the CMOS image sensor may include one photodiode and four transistors as a unit pixel such that an image can be detected from the incident light. However, the present general inventive concept is not limited thereto. Other type of an image sensor can be used as the image sensor 110 of the present general inventive concept. It is also possible that a signal sensor can be used as the sensor of the present general inventive concept to sense an external signal transmitted through a transmission element, such as the lens member 140. Therefore, the variable thickness member 130 can be used to control a distance and/or angle between the image sensor 110 and the lens member 140 such that the external signal, such as the light beam, can be controlled to be detected at the image sensor 110 according to a desired condition of the incident light, electrical signal, and/or sensed image.

In an embodiment, the image sensor 110 may include a substrate 111, an external terminal 121, a bonding pad 125 and an electrode 127.

The substrate 111 may include a light receiver 113 formed on a central upper surface of the substrate 111 to receive a light. The light receiver 113 may have the photodiode and the transistors.

The image sensor 110 may further include an electrode (circuit) 113a disposed inside the substrate 111 to be connected to the light receiver 113 to transmit (process) the electrical signal, an external terminal 113b, and a conductive line 113c formed on the substrate 111 to electrically connect the electrode or circuit 113a to the external terminal 113b such that the image sensor 110 can communicate with an external device. The electrode (circuit) 113a may be disposed outside the substrate 111 to connect the image sensor 110 and the external terminal 113b.

The external terminal 121 may be mounted on a first surface of the substrate 111. In an embodiment, the first surface of the substrate 111 may correspond to a lower surface of the substrate 111. The external terminal 121 may be electrically connected to the electrode 127. The external terminal 121 may receive a driving voltage from an external device and then transmit the driving voltage to the variable thickness member 130 through the electrode 127. The external terminal 121 may include a solder ball.

In an embodiment, the external terminal 121 may further include an under bump metallurgy (UBM) to improve a wettability. The external terminal 121 having the UBM may make contact with a solder paste to easily form the solder ball.

A bonding pad 125 may be arranged on a second surface of the substrate 111 opposite to the first surface. That is, the bonding pad 125 may be arranged on an upper surface of the substrate 111. In an embodiment, the bonding pad 125 may be located on an edge portion of the second surface of the substrate 111. The bonding pad 125 may make contact with the variable thickness member 130 to transmit the driving voltage to the variable thickness member 130.

In an embodiment, the bonding pad 125 may have a rectangular plate shape. Further, the bonding pad 125 may include a conductive metal such as gold (Au), silver (Ag), copper (Cu), chromium (Cr), aluminum (Al), nickel (Ni), tin or stannum (Sn), lead or plumbum (Pb) or an alloy thereof.

In an embodiment, when the substrate 111 has the rectangular plate shape, the bonding pad 125 may be arranged on corners of the substrate 111. Thus, the driving voltage may be uniformly applied to the variable thickness member 130 through the bonding pad 125 on the corners of the substrate 111.

The electrode 127 may vertically penetrate an edge portion of the substrate 111. The electrode 127 may have an upper end to make contact with the bonding pad 125, and a lower end to make contact with the external terminal 121. That is, the bonding pad 125 and the external terminal 121 may be electrically coupled with each other via the electrode 127. Thus, the driving voltage may be applied to the variable thickness member 130 through the electrode 127 in the edge portion of the substrate 111. It is possible that a wire to transmit the driving voltage to the variable thickness member 130 may not be needed in the image sensor module 100.

In an embodiment, the electrode 127 may include a material substantially the same as that of the bonding pad 125. Alternatively, the electrode 127 may include a material different from that of the bonding pad 125. The electrode 127 may include a conductive metal such as gold (Au), silver (Ag), copper (Cu), chromium (Cr), aluminum (Al), nickel (Ni), stannum (Sn), plumbum (Pb) or an alloy thereof.

In an embodiment, the image sensor 110 may further include a connecting line 129 formed on the first surface of the substrate 111. The connecting line 129 may connect the external terminal 121 to the electrode 127. The connecting line 129 may extend from a central pad (not illustrated), which may be formed on a central portion of the first surface of the substrate 111, toward the electrode 127.

Since a location or length of the connecting line 129 can be changed or adjusted with respect to the electrode 127, a position of the external terminal 121 can be changed or adjusted with respect to the substrate 111. When it is desirable to dispose the external terminal 121 on a certain portion of the substrate 111, the connecting line 129 can be extended from a position of the electrode 127 toward the desired position of the substrate 111. Accordingly, an external device having a connector can be connected to the external terminal 121 according to a location of the connector thereof.

The variable thickness member 130 may be arranged on the edge portion of the image sensor 110. Because the light receiver 113 may be arranged on the central portion of the image sensor 110, the variable thickness member 130 may not be overlapped with the light receiver 113. The variable thickness member 130 may have a thickness varying along an optical axis of the light in accordance with the driving voltage from the bonding pad 125 of the image sensor 110. That is, when the driving voltage may be applied to the variable thickness member 130, a volume or a phase of the variable thickness member 130 may be changed, so that the thickness of the variable thickness member 130 may also be changed along the optical axis.

In an embodiment, the variable thickness member 130 may have an annular shape configured to cover the bonding pad 125. As a result, the light receiver 113 may be exposed by the variable thickness member 130 on the edge portion of the image sensor 110.

In an embodiment, referring to FIG. 3, the variable thickness member 130 may include a first electrode 131, a second electrode 135 to face the first electrode 131, and a conductive polymer layer 133 interposed between the first electrode 131 and the second electrode 135. The conductive polymer layer 133 may include a piezoelectric material. For example, when a potential difference may be generated between the first electrode 131 and the second electrode 135, a volume or a phase of the piezoelectric material between the first electrode 131 and the second electrode 135 may be changed. Therefore, the thickness of the variable thickness member 130 may vary along an optical axis of the light.

The variable thickness member 130 may be controlled to change a thickness with respect to the image sensor 110 and/or the lens member 140 in a first direction perpendicular to a second direction of a major surface of the light receiver 113 and/or the lens layer 143. The major surface may be parallel to the first surface or the second surface of the substrate 111. The first direction may be parallel to a light incident direction in which a light beam is incident to the light receiver 113 through the lens member 140.

The variable thickness member 130 may have an area disposed parallel to the major surface of the light receiver 113 and/or the lens layer 143 or disposed parallel to the second direction. The entire area of the variable thickness member 130 may move in the same direction by a same distance with respect to the image sensor 110 and/or the lens member 140 according to the driving signal applied from a controller of an electronic apparatus to the electrode 127 of the variable thickness member 130.

It is possible that the area of the variable thickness member 130 may move in a direction having an angle with the above describe direction. That is, the area of the variable thickness member 130 may have an angle with the first direction or the second direction. FIG. 2 illustrates four bonding pads 125 to correspond to the respective electrodes 127. However, the present general inventive concept is not limited thereto. The number of the electrodes 127 and bonding pads 125 can be more than four or can be two. When a first driving voltage (or signal) is applied to a first combination of the four electrodes 127 and a second driving voltage (or signal) is applied to a second combination of the four electrodes 127, the thickness of the variable thickness member 130 may vary according to locations of the first and second combinations of the four electrodes 127 or according to areas or positions or the bonding pads 125 contacting the variable thickness member 130 such that the lens member 140 can move in a direction having an angle with respect to the first and second directions.

When it is required to move the lens member 140 in a same direction by a same distance with respect to the light receiver 113, a same driving voltage (signal) is applied to the four electrodes 127 as the first and second driving voltage (signal).

When a first portion of the variable thickness member 130 has a first characteristic different from a second characteristic of a second portion of the variable thickness member 130 in controlling the thickness, it is possible to apply different driving voltages (signals) to the respective electrodes to obtain a uniform thickness change such that the lens member 140 can move in a desired direction with respect to the light receiver 113.

The above-described thickness change may correspond to a volume change of the variable thickness member 130. The change of the variable thickness member 130 in thickness or volume may correspond to a change in distance between the image sensor 110 and the lens member 140.

One of the first electrode 131 and the second electrode 135 (FIG. 3) may be connected to the electrode 127 through the bonding pad 125, and the other one of the first electrode 131 and the second electrode 135 may be connected to a potential, for example, a ground potential. Therefore, a potential difference between the driving voltage and the potential generate a volume change of the conductive polymer layer 133 such that a distance and angle of the lens member 140 is changed with respect to the light receiver 113. The one of the first electrode 131 and the second electrode 135 may be connected to the electrode 111 without the bonding pad 125. The bonding pad 125 may be disposed in the substrate 127 to contact the one of the first electrode 131 and the second electrode 135. In this case, the bonding pad 125 may have an outer surface disposed on a plane on which the second surface of the substrate 111 is disposed. The bonding pad 125 and the electrode 127 may be formed in a monolithic conductive body.

The lens member 140 may be arranged on the variable thickness member 130. Here, because the lens member 140 may make contact with the variable thickness member 130, a position of the lens member 140 may vary in accordance with the variable thickness of the variable thickness member 130.

For example, when the thickness of the variable thickness member 130 may be increased by applying the driving voltage to the variable thickness member 130, the lens member 140 may be upwardly moved to increase a distance between an upper surface of the image sensor 110 and the lens member 140. In contrast, the thickness of the variable thickness member 130 may be decreased by suspending the applying of the driving voltage to the variable thickness member 130, the lens member 140 may be downwardly moved to decrease the distance between the upper surface of the image sensor 110 and the lens member 140. Thus, a focus of the image sensor module 100 may be automatically adjusted until the image sensor module 100 may have an optimal resolution by changing the distance between the lens member 140 and the image sensor 110. As a result, the focus of the image sensor module 100 may be automatically adjusted by applying the driving voltage to the variable thickness member 130 without an automatic focusing device.

Further, when a wafer level image sensor module may be manufactured by attaching the image sensor 110 to the lens member 140, an attachment clearance may be generated between the image sensor 110 and the lens member 140. Although the attachment clearance may be generated between the image sensor 110 and the lens member 140, the driving voltage may be applied to the variable thickness member 130 to change the thickness of the variable thickness member 130. As a result, the distance between the image sensor 110 and the lens member 140 may be optimally adjusted to control the focus of the image sensor module 100.

In an embodiment, the lens member 140 may include a protecting layer 141 and a lens layer 143 formed on the protecting layer 141. Further, the lens member 140 may have a structure where a plurality of the lens layers 143 may be stacked. For example, the lens member 140 may include the two lens layers 143. Alternatively, the lens member 140 may include at least three lens layers 143. Additionally, the lens member 140 may further include an infrared ray blocking film (not illustrated). The infrared ray blocking film may filter an infrared ray having a long wavelength in the light incident to the light receiver 113. Further, the lens member 140 may additionally include an anti-reflective film (not illustrated) to suppress a reflection of the light. Alternatively, the lens member 140 may include at least one lens layer 143 without the protecting layer 141.

In an embodiment, the image sensor module 100 may further include an adhesive member (not illustrated) interposed between the variable thickness member 130 and the image sensor 110 to attach the variable thickness member 130 to the image sensor 110.

A space C can be formed between surfaces of the lens member 140 and the image sensor 110. The space C may be filled with a material, such as a gas with a predetermined pressure. It is also possible that the space C may be in a vacuum state or may have a pressure close to the vacuum state. However, it is possible that the pressure of the space C may be a normal air pressure in a room temperature.

It is possible that an external surface of the light receiver 113 may be on a plane on which the second surface of the substrate 111 is disposed. In this case, at least a portion of the light receiver 113 protrudes from the second surface of the substrate 111 toward the space C. it is also possible that the portion of the light receiver 113 is spaced apart from a bottom surface of the lens member 140 by a variable distance when the second surface of the substrate 111 is spaced apart from the bottom surface of the lens member 140 by a second variable distance.

Figure 4:
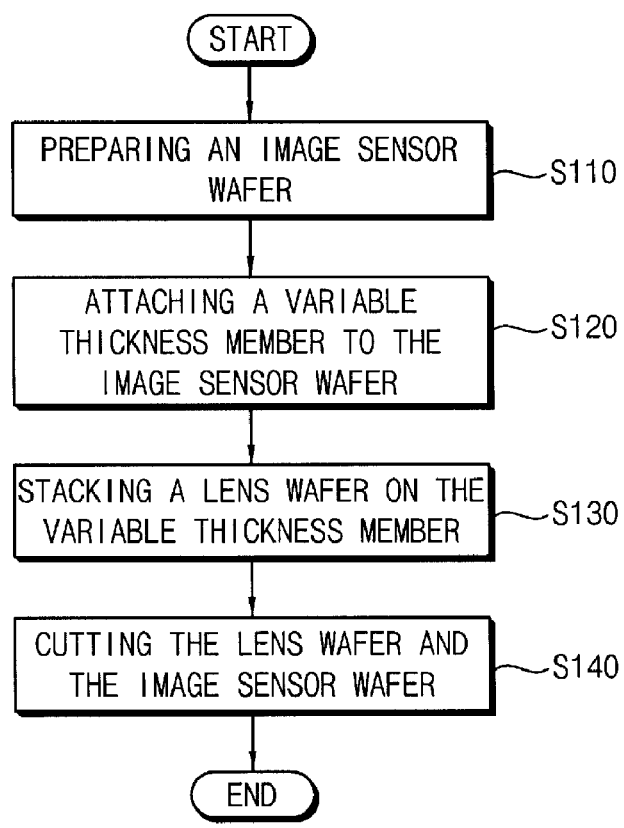
FIG. 4 is a flow chart illustrating a method of manufacturing an image sensor module according to an embodiment of the present general inventive concept.
Figure 5A:
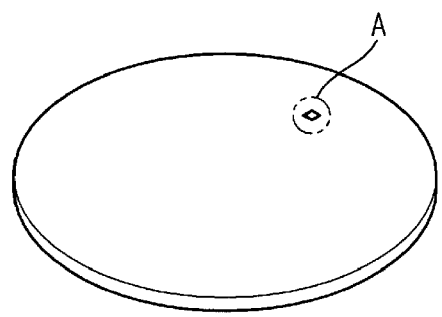
FIG. 5A is a perspective view illustrating a process to prepare an image sensor wafer.
Figure 5B:
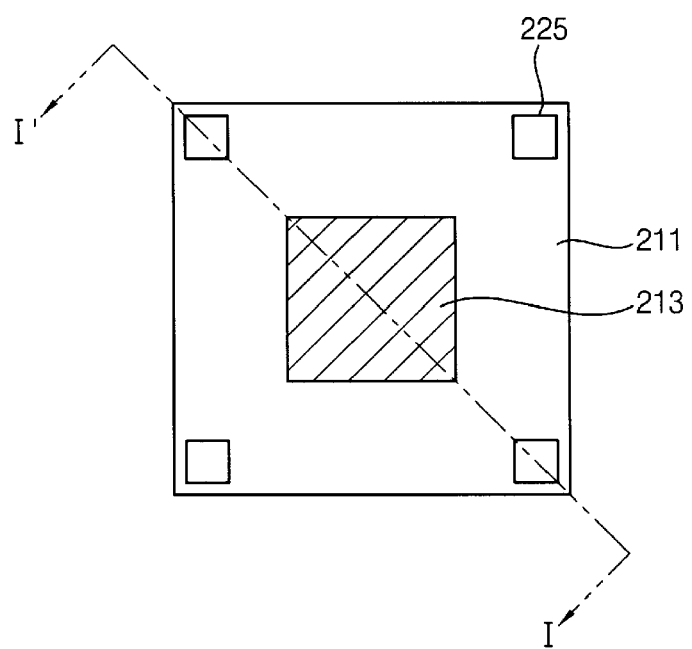
FIG. 5B is an enlarged plan view illustrating a portion "A" in FIG. 5A.
Figure 5C:
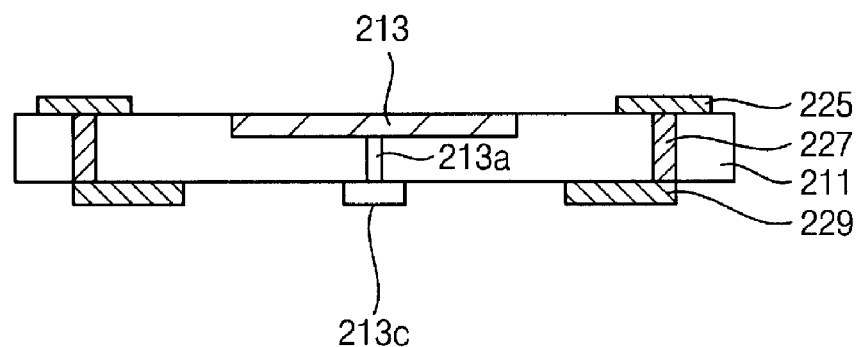
FIG. 5C is a cross-sectional view taken along a line I-I' in FIG. 5B.

FIG. 4 is a flow chart illustrating a method of manufacturing the image sensor module in FIG. 1, FIG. 5A is a perspective view illustrating a process to prepare an image sensor wafer, FIG. 5B is an enlarged plan view illustrating a portion "A" in FIG. 5A, and FIG. 5C is a cross-sectional view taken along a line I-I' in FIG. 5B.

Referring to FIGS. 4 and 5A to 5C, in operation S110, an image sensor wafer 211 may be prepared. In an embodiment, the image sensor wafer 211 may include a plurality of image sensors 210 and a bonding pad 225. A driving voltage may be applied to the bonding pad 225.

Further, the image sensor wafer 211 may include a light receiver 213, an electrode 227 and the bonding pad 225. Additionally, the image sensor wafer 211 may include a data pad and a ground pad formed on an upper surface of the image sensor wafer 211. A data signal may be applied to the data pad. A reference voltage may be applied to the ground pad. The data pad and the ground pad may be exposed. Thus, to suppress an electrical connection between the bonding pad 225 and other pads, an additional process may be performed to selectively expose the bonding pad 225.

In an embodiment, the image sensing wafer 211 may include an electrode 213a as a circuit or a conductive line to be connected to the light receiver 213 to transmit or process the data signal of the incident signal, such as the light beam signal, and a pad 213c may be formed on the image sensing wafer 211 to be electrically connected to the electrode 213a.

Figure 6A:
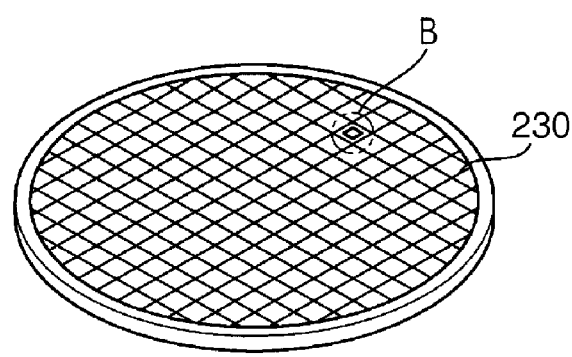
FIG. 6A is a cross-sectional view illustrating a variable thickness member in accordance with some example embodiments.
Figure 6B:
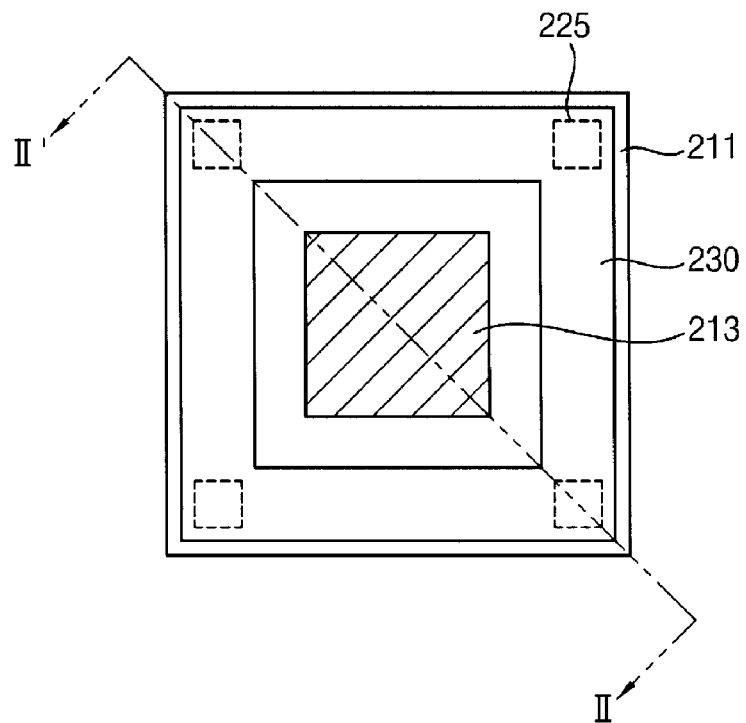
FIG. 6B is an enlarged plan view illustrating a portion "B" in FIG. 6A.
Figure 6C:
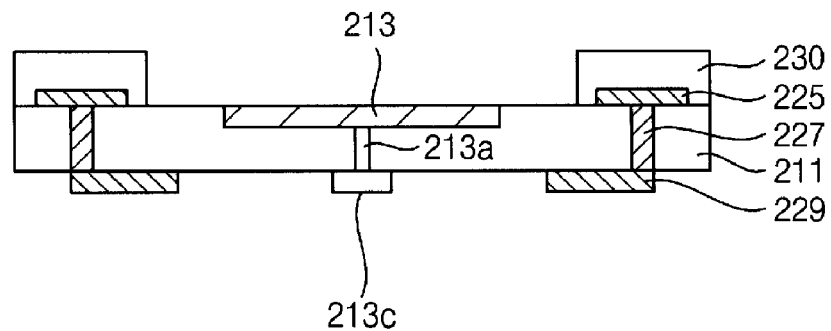
FIG. 6C is a cross-sectional view taken along a line II-II' in FIG. 6B.

FIG. 6A is a cross-sectional view illustrating a variable thickness member in accordance with some example embodiments, FIG. 6B is an enlarged plan view illustrating a portion "B" in FIG. 6A, and FIG. 6C is a cross-sectional view taken along a line II-II' in FIG. 6B.

Referring to FIGS. 4 and 6A to 6C, in operation S120, a variable thickness member 230 may be formed on an edge portion of the image sensor wafer 211. Here, because the light receiver 213 may be placed on the central portion of the image sensor wafer 211, the variable thickness member 230 may not be overlapped with the light receiver 213. That is, the variable thickness member 230 may be overlapped with the bonding pad 225 and the electrode 227.

In an embodiment, a variable thickness layer (not illustrated) may be formed on the image sensor wafer 211. The variable thickness layer may be attached to the image sensor wafer 211 by a thermo compression bonding process or an ultraviolet curing process. In the thermo compression bonding process, the variable thickness layer may be compressed toward the image sensor wafer 211 at a predetermined temperature to attach the variable thickness layer to the image sensor wafer 211. In the ultraviolet curing process, an ultraviolet ray may be irradiated to the variable thickness layer to cure the variable thickness layer by a photoreaction of a photo initiator in the variable thickness layer, thereby attaching the variable thickness layer to the image sensor wafer 211.

A light may then be irradiated to the variable thickness layer using a mask to pattern the variable thickness layer, thereby forming the variable thickness member 230 on the image sensor wafer 211. The variable thickness member 230 may be electrically connected to the bonding pad 225.

In an embodiment, the variable thickness member 230 may include a conductive polymer layer such as a piezoelectric material.

Figure 7A:
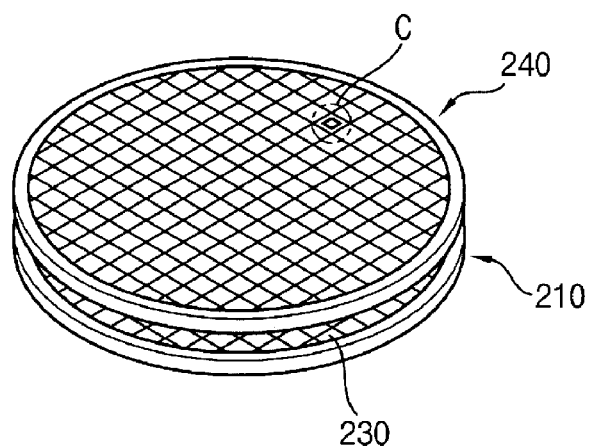
FIG. 7A is a perspective view illustrating a process to combine a lens wafer and a variable thickness member according to an embodiment of the present general inventive concept.
Figure 7B:
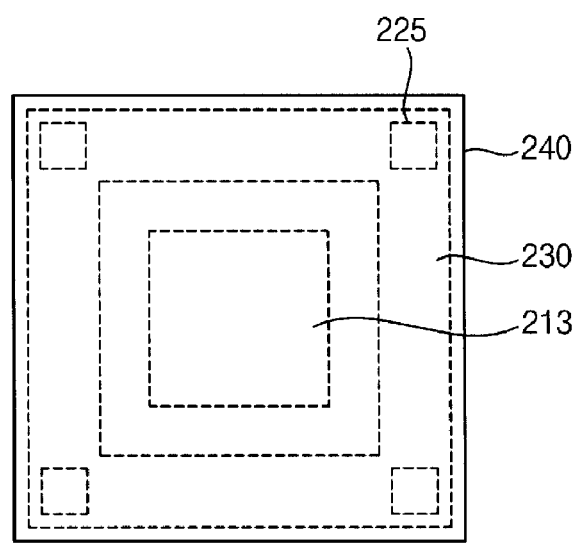
FIG. 7B is an enlarged plan view illustrating a portion "C" in FIG. 7A.
Figure 7C:
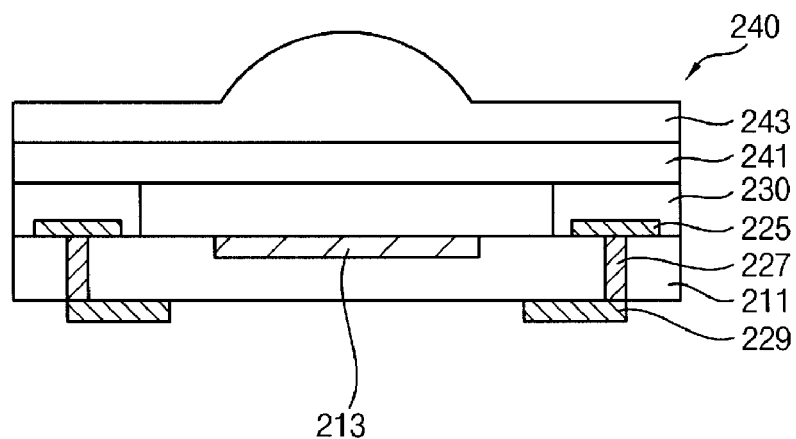
FIG. 7C is a cross-sectional view taken along a line III-III' in FIG. 7B.

FIG. 7A is a perspective view illustrating a process to combine or stack a lens wafer on a variable thickness member according to an embodiment of the present general inventive concept, FIG. 7B is an enlarged plan view illustrating a portion "C" in FIG. 7A, and FIG. 7C is a cross-sectional view taken along a line III-III' in FIG. 7B.

Referring to FIGS. 4 and 7A to 7C, in operation S130, a lens wafer 240 may be stacked on the image sensor wafer 211 having the variable thickness member 230. In some example embodiments, the lens wafer 240 may be attached to the image sensor wafer 211 by a thermo compression bonding process. Further, the lens wafer 240 may include at least one lens layer 214.

In the thermo compression bonding process, an adhesive layer (not illustrated) may be formed on a lower surface of the lens wafer 240. In an embodiment, the adhesive layer may include a high polymer resin. Further, the adhesive layer may have a latticed structure configured to attach the lens wafer 240 to the image sensor wafer 211. After dicing, the adhesive layer may seal between an image sensor and a lens member in an image sensor module. A heat and a pressure may be applied to the image sensor wafer 211 and the lens wafer 240. The image sensor wafer 211 and the lens wafer 240 may then be post-cured to attach the lens wafer 240 to the image sensor wafer 211.

In an embodiment, a connecting line 229 (FIG. 7C) may be further formed on a lower surface of the image sensor wafer 211. The connecting line 229 may be electrically connected to the electrode 227. The connecting line 229 may extend from a central pad (not illustrated) on a central portion of the image sensor wafer 211 toward the electrode 227.

In an embodiment, a protecting layer 241 may be formed between the lens wafer 240 and the image sensor wafer 211. The protecting layer 241 may include a glass substrate. The protecting layer 241 may protect the image sensor wafer 211 from foreign substances.

Figure 8:
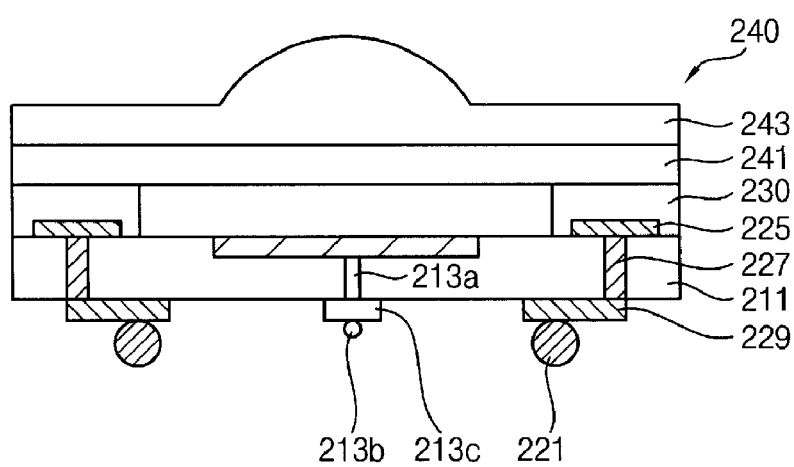
FIG. 8 is a cross-sectional view illustrating a process to cut a lens wafer and an image sensor wafer according to an embodiment of the present general inventive concept.

FIG. 8 is a cross-sectional view illustrating a process to cut a lens wafer and an image sensor wafer according to an embodiment of the present general inventive concept.

Referring to FIGS. 4 and 8, in operation S140, the image sensor wafer 211 and the lens wafer 240 attached to each other may be cut along the adhesive layer to form an image sensor module 200. In some example embodiments, the image sensor wafer 211 and the lens wafer 240 may be cut using a dicing apparatus having a blade.

Therefore, the image sensor module 200 may include an image sensor 210, the variable thickness member 230 and a lens member 240.

As illustrated in FIG. 8, the image sensing wafer 211 may include an electrode 213a as a circuit or a conductive line to be connected to the light receiver 213 to transmit or process the data signal of the incident signal, such as the light beam signal, a pad 213c may be formed on the image sensing wafer 211 to be electrically connected to the electrode 213, and an external terminal 213b may be formed on the pad 213c to be connected to an external device.

Figure 9:
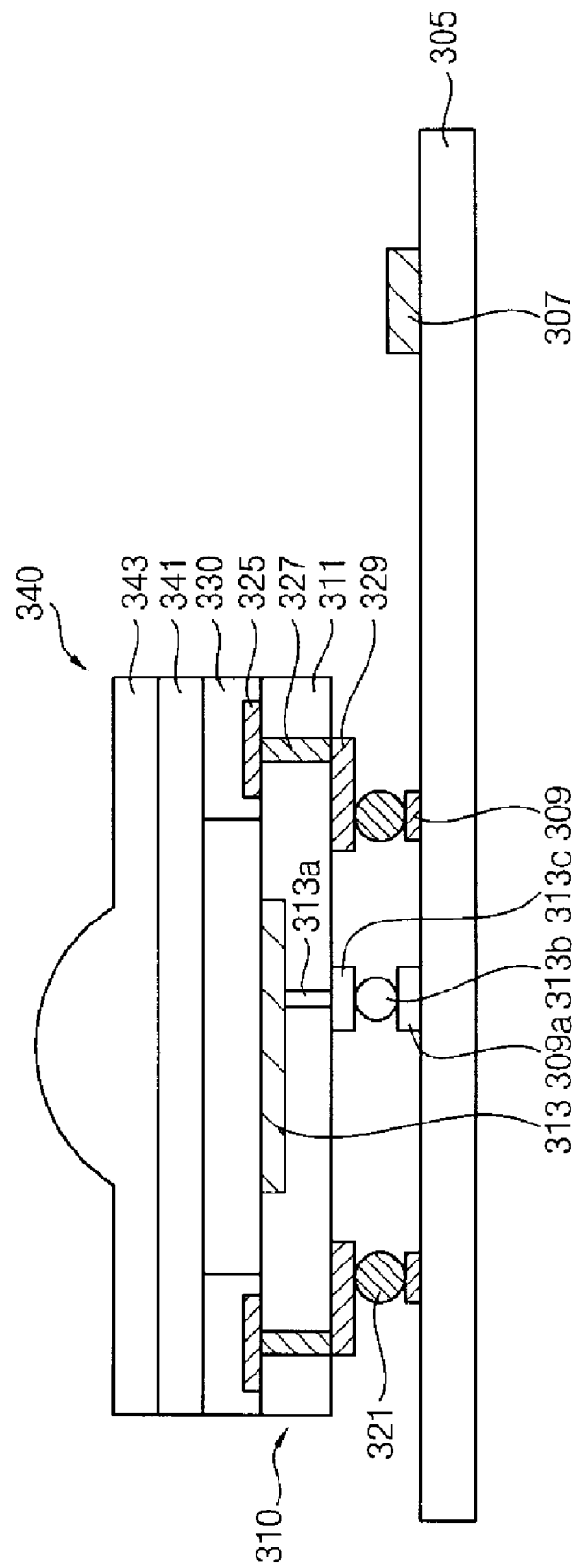
FIG. 9 is a cross-sectional view illustrating a camera according to an embodiment of the present general inventive concept.

FIG. 9 is a cross-sectional view illustrating a camera module according to an embodiment of the present general inventive concept.

Referring to FIG. 9, the camera module of this example embodiment may include a main substrate 305, an image sensor 310, a variable thickness member 330 and a lens member 340.

In an embodiment, the main substrate 305 may include a controller 307 to generate a driving voltage. The controller 307 may include a digital signal processing chip mounted on the main substrate 305. Alternatively, the controller 307 may be built in the image sensor 310. A connecting pad 309 may be mounted on the main substrate 305 to be connected to the controller 307. The connecting pad 309 may be electrically connected to an external terminal 321.

In an embodiment, the image sensor 310 may include a substrate 311, at least one external terminal 321, at least one bonding pad 325 and at least one electrode 327. The substrate 311 may have a light receiver 313. The external terminal 321 may be mounted on a first surface of the substrate 311. The driving voltage may be applied to the external terminal 321. The bonding pad 325 may be formed on a second surface of the substrate 311 opposite to the first surface. The bonding pad 325 may be electrically connected to the variable thickness member 330. The electrode 327 may penetrate an edge portion of the substrate 311. The electrode 327 may electrically connect the external terminal 321 with the bonding pad 325 through a pad 329.

The image sensor 310, the variable thickness member 330 and the lens member 340 may be mounted on the main substrate 305. The image sensor 310, the variable thickness member 330 and the lens member 340 may be electrically connected to the connecting pad 309. Here, the image sensor 310, the variable thickness member 330 and the lens member 340 may be substantially similar to the image sensor 110, the variable thickness member 130 and the lens member 140 in FIG. 1, respectively. Thus, any further illustrations with respect to the image sensor 310, the variable thickness member 330 and the lens member 340 are omitted herein for brevity.

The image sensor module having the variable thickness member 330 may be mounted on the main substrate 305. The image sensor module having the variable thickness member 330 may function as a mechanical actuator for automatically controlling a focus of the camera module. Thus, the camera module may include the wafer level image sensor module.

As illustrated in FIG. 9, the image sensor 310 may include an electrode 313a formed in the substrate 311 as a circuit or a conductive line to be connected to the light receiver 313 to transmit or process the data signal of the incident signal, such as the light beam signal, a pad 313c may be formed on the substrate 311 to be electrically connected to the electrode 213, and an external terminal 313b may be formed on the pad 313c to be connected to an external device. Another connecting pad 309a may be formed on the main substrate 305 to be connected to the external terminal 313b.

The pads 329 and 313c may have a location and a length with respect to the electrode 327 and 313a, respectively, so that the connecting pads 309 and 309a can be connected to the respective external terminals 321 and 313b according to a predetermined specification of the image sensor and the main substrate 305. Therefore, the image sensor can easily be connected to the main substrate 305 using relative positions of the electrodes 327 and 313a and the connecting pads 309 and 309a.

Figure 10:
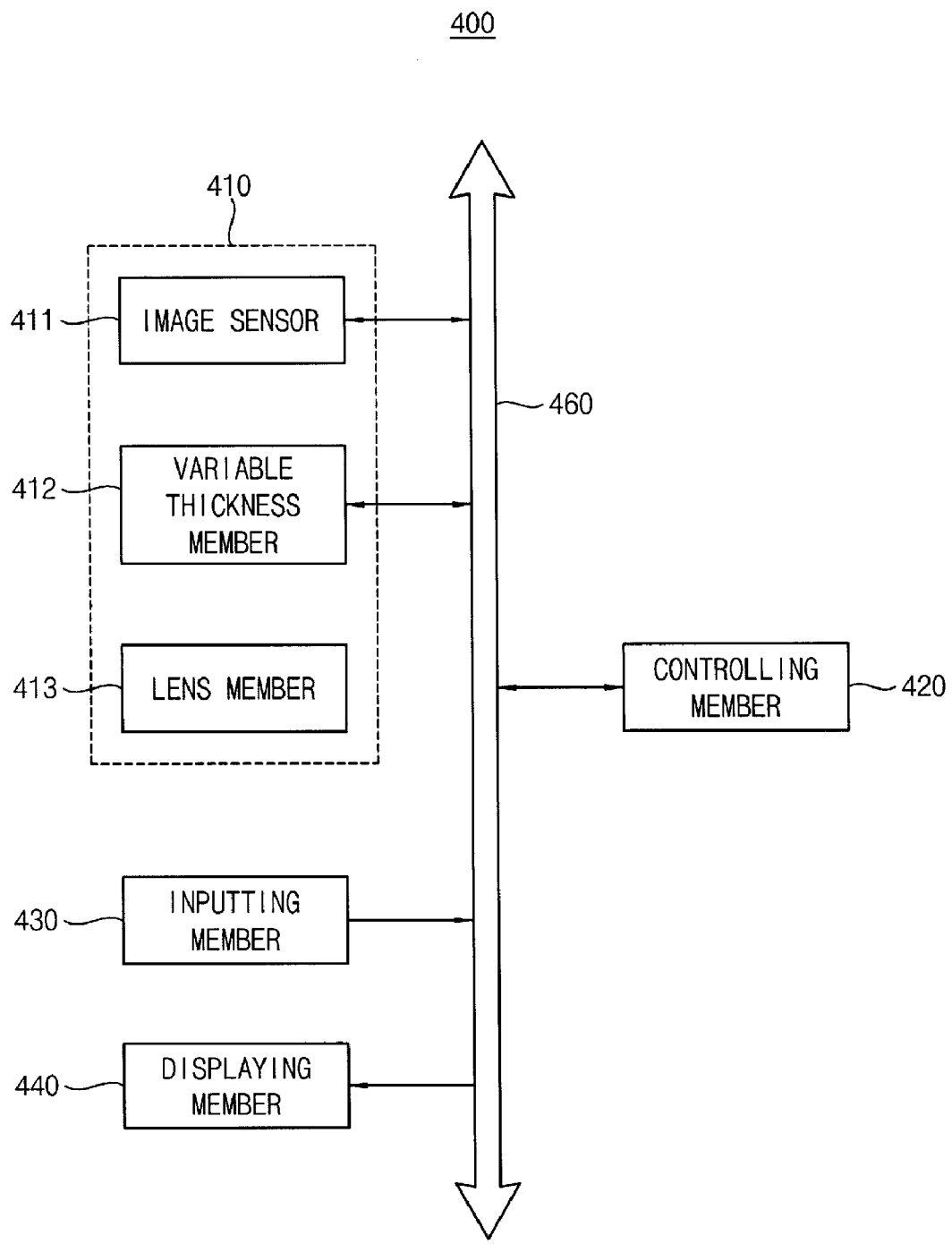
FIG. 10 is a block diagram illustrating an electronic device according to an embodiment of the present general inventive concept.

FIG. 10 is a block diagram illustrating an electronic device according to an embodiment of the present general inventive concept.

Referring to FIGS. 9 and 10, the electronic device 400 of this example embodiment may include a camera module 410, a controlling member 420, an inputting member 430 and a displaying member 440. According to the present general inventive concept, the electronic device may include a camera phone. However, the present general inventive concept is not limited thereto. The electronic device may be an apparatus to detect an image or an object, to process data corresponding to the image or object, and to perform an operation using the processed data.

The camera module 410 may include the main substrate 305 (See FIG. 9), an image sensor 411, a variable thickness member 412 and a lens member 413. The main substrate 305 may generate a driving voltage. The image sensor 411 may include a light receiver configured to receive a light. The driving voltage may be applied to the image sensor 411. The variable thickness member 412 may be arranged on the image sensor 411 adjacent to the light receiver. The variable thickness member 412 may have a variable thickness along an optical axis of the light in accordance with the driving voltage from the image sensor 411. The lens member 413 may be arranged on the variable thickness member 411. The lens member 413 may be moved along the optical axis in accordance with the variable thickness of the variable thickness member 412. Here, the camera module 410 may be substantially similar to the camera module in FIG. 9. Thus, any further illustrations with respect to the camera module 410 are omitted herein for brevity.

The controlling member 420 may apply a control signal to the camera module. For example, when a use may input an operational command to the electronic device 400, the controlling member 420 may apply a corresponding control signal to the camera module 420.

The inputting member 430 may include inputting terminals (not illustrated). The user may input a specific command for driving the electronic device 400 through the inputting terminals. Examples of the inputting terminals may include a key pad, a touch screen, etc., of a communication device.

The displaying member 440 may display an image using image signals generated from the camera module 410. Examples of the displaying member 440 may include a liquid display device (LCD), an organic emitting device, etc.

Further, the electronic device 400 may include a communicating member 460 to transmit signals between the camera module 410, the controlling member 420, the inputting member 430 and the displaying member 440 with each other.

According to an embodiment, the image sensor module having the variable thickness member may function as a mechanical actuator to automatically control a focus of the camera module. Thus, the camera module may include the wafer level image sensor module. As a result, a smaller electronic device may be manufactured.

Further, the variable thickness member may have a variable thickness along an optical axis of the light in accordance with the driving voltage through the image sensor. The lens member may be arranged on the variable thickness member. The lens member may be moved along the optical axis in accordance with the thickness of the variable thickness member. Thus, a focus of the image sensor module may be automatically controlled.

Further, the image sensor module may be employed in a cellular camera phone having an automatic focusing device. However, the present general inventive concept is not limited thereto. An electronic apparatus having a sensor to detect an external signal, a transmitter to receive and transmit the external signal, and an electrically controlled member to adjust a distance or angle of the transmitter with respect to the sensor can be used as the image sensor of the present general inventive concept. Furthermore, the image sensor module may be employed in a small, slim and light camera module Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents

What is claimed is:

1. A method of manufacturing an image sensor module, the method comprising:
    preparing an image sensor wafer that includes at least one image sensor and a bonding pad configured to receive a driving voltage;
    attaching a variable thickness member to the image sensor wafer, the variable thickness member having a variable thickness along an optical axis of the light in accordance with the driving voltage; and
    forming a lens wafer including at least one lens layer on the variable thickness member.

2. The method of claim 1, wherein preparing the image sensor wafer comprises:
    forming an image sensor having the light receiver on a substrate;
    forming a bonding pad on an edge portion of the substrate; and
    forming an electrode in the edge portion of the substrate to electrically connect the bonding pad.

3. The method of claim 1, wherein the variable thickness member is attached to the image sensor wafer by a thermo compression bonding process.

4. The method of claim 1, wherein the variable thickness member is attached to the image sensor wafer by an ultraviolet curing process.

5. The method of claim 1, wherein the variable thickness member comprises a conductive polymer having a variable volume in accordance with the driving voltage.

6. The method of claim 5, wherein the conductive polymer comprises a piezoelectric material.

7. The method of claim 1, wherein:
    the image sensor wafer comprises a plurality of the image sensors;
    the lens wafer comprises the at least one lens layer; and
    the method further comprises:
        forming the lens wafer including the at least one lens layer on the variable thickness member; and
        cutting the lens wafer to form an image sensor module including a single image sensor and a single lens layer.

* * * * *